United States Patent
Liu et al.

(10) Patent No.: US 6,608,499 B2
(45) Date of Patent: Aug. 19, 2003

(54) METHOD FOR COMPENSATING A THRESHOLD VOLTAGE OF A NEIGHBOR BIT

(75) Inventors: Tseng-Yi Liu, Taipei Hsien (TW);
Han-Sung Chen, Hsinchu (TW);
Cheng-Jye Liu, Taoyuan Hsien (TW);
Chia-Hsing Chen, Hsinchu (TW);
Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/128,717

(22) Filed: Apr. 23, 2002

(65) Prior Publication Data

US 2003/0011399 A1 Jan. 16, 2003

(30) Foreign Application Priority Data

Jul. 13, 2001 (TW) ........................................ 90117180 A (51) Int. Cl.⁷ .................... H03K 19/23; H03K 19/0175; G11C 16/04

(52) U.S. Cl. ....................... 326/35; 326/83; 365/185.24

(58) Field of Search ............................... 326/35, 36, 82, 326/83, 86; 365/185.24, 185.02, 185.18

(56) References Cited

U.S. PATENT DOCUMENTS 5,258,657 A * 11/1993 Shibata et al. ................. 326/35
6,269,023 B1 * 7/2001 Derhacobian et al. . 365/185.24
6,456,536 B1 * 9/2002 Sobek et al. ........... 365/185.28

* cited by examiner

*Primary Examiner*—Daniel Chang
*Assistant Examiner*—James Cho
(74) *Attorney, Agent, or Firm*—J.C. Patents (57) ABSTRACT

A method for compensating a threshold voltage of a neighbor bit, are provided. The method includes the first step of arbitrating the word line voltages applied to bits demanded to be programmed, wherein the the word line voltages are arbitrated according to the threshold voltages of the neighbor bits adjacent to the bits. Next, the bits, to which a same word line voltage should be applied, in the memory cells are distributed to a group of bits with the same word line voltage. Then, the same word line voltage is applied to the bits of the group of bits with the same word line voltage.

14 Claims, 10 Drawing Sheets

|  | bit0 | bit1 | bit2 | bit3 | bit4 | bit5 | bit6 | bit7 |
|---|---|---|---|---|---|---|---|---|
| Bit Data | 0 | 1 | 0 | 0 | 0 | 1 | 0 | 0 |
| Neighbor Bit | Lvt | X | Hvt | Lvt | Lvt | X | Lvt | Hvt |

|  | bit8 | bit9 | bit10 | bit11 | bit12 | bit13 | bit14 | bit15 |
|---|---|---|---|---|---|---|---|---|
| Bit Data | 0 | 1 | 0 | 1 | 0 | 0 | 1 | 1 |
| Neighbor Bit | Lvt | X | Hvt | X | Lvt | Lvt | X | X |

X: no dispose
Lvt: low threshold voltage
Hvt: high threshold voltage

METHOD FOR COMPENSATING A THRESHOLD VOLTAGE OF A NEIGHBOR BIT

CROSS-REFERENCE TO RELATED APPLICATION

This application claims the priority benefit of Taiwan application serial no. 90117180, filed Jul. 13, 2001.

BACKGROUND OF THE INVENTION

1. Field of the Invention

The invention relates in general to a method to compensate a threshold voltage of a neighbor bit while programming on a memory cell of a flash memory. More particularly, the invention relates to a method to compensate a threshold voltage of a neighbor bit while programming on a memory cell of a trapping device.

2. Description of the Related Art

Figure 1:
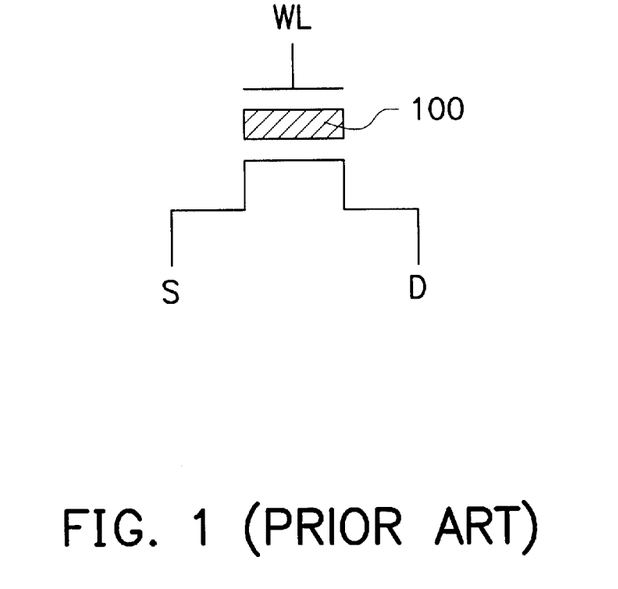
FIG. 1 is a schematic drawing of a floating-gate transistor according to prior art.

In general, a flash memory is provided with plenty of memory cells for saving data. FIG. 1 shows a conventional memory cell device including a floating gate transistor in a flash memory. The floating gate transistor comprises a floating gate 100 in a floating state for storing an electric charge used for saving data.

However, only one bit of data can be written into the memory cell while programming thereon.

Figure 2:
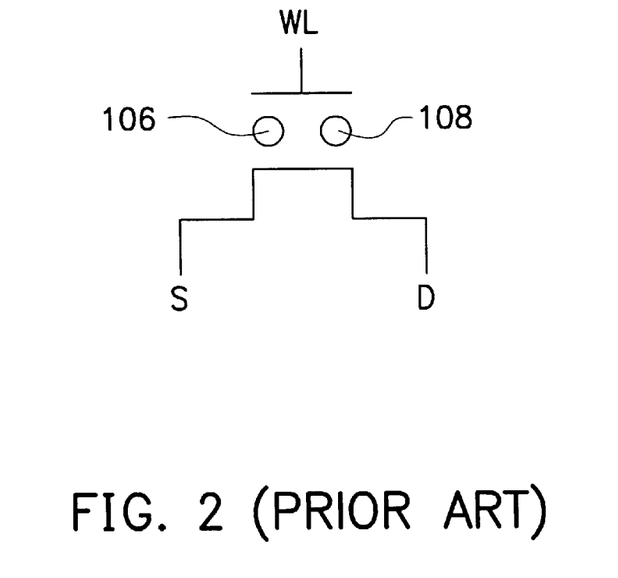
FIG. 2 is a schematic drawing of a trapping device according to prior art.

An Israelite Saifun proposed a NROM memory cell device, a kind of trapping device, as shown in FIG. 2 to resolve the above problem. The feature of the memory cell device is that it has two bits, a bit 106 and a bit 108, for saving two bits of data wherein each of the bits can store a bit of data. However, the electric charges of the neighbor bit can affect each other. In other words, if the bit 106 is previously programmed in a state of a high threshold voltage, the speed of programming the bit 108 will slow down.

SUMMARY OF THE INVENTION

Accordingly, this invention provides a method for compensating threshold voltages of neighbor bits to prevent the electric charges of the two bits in the trapping device from interacting while programming the two bits. In addition, the electric charges of the two bits can also be attracted relatively fast to shorten programming time.

A method for compensating a threshold voltage of a neighbor bit comprising the first step of arbitrating the word line voltages applied to the bits which are to be programmed, for instance, the memory cells of trapping devices. The word line voltages are arbitrated according to the threshold voltages of the neighbor bits adjacent to the bits, which are being programmed.

The sequent step is applying a word line voltage, a value which is obtained by the result of the above-mentioned arbitration, to the bits to simultaneously program the bits.

However, during the operation of a low supply-source voltage, the charge pumping circuits cannot supply enough energy to the memory cells for programming them at the same time.

Accordingly, this invention further provides a method for compensating a threshold voltage of a neighbor bit. The method includes clustering bits, to which a same word line voltage is applied, so that the charge pumping circuits can provide enough energy to program the clustered bits at the same time. Wherein, a flash memory comprises a plurality of trapping devices. Each trapping device has two bits, and each bit can store a bit of data. The so-called trapping devices are the above-mentioned memory cells.

The method for compensating a threshold voltage of a neighbor bit comprises the first step of arbitrating word line voltages applied to bits, which are to be programmed in the memory cells. The word line voltages are arbitrated according to the threshold voltages of the neighbor bits adjacent to the bits which are to be programmed.

The subsequent step is distributing the bits, to which a first word line voltage should be applied, to a first group of the same word line voltage. Next, the first word line voltage is applied to the bits of the first group of the same word line voltage in accordance with the distributing result.

Afterwards, the bits, to which a second word line voltage should be applied, are distributed to a second group of bits with the same word line voltage. Next, the second word line voltage is applied to the second group of bits with the same word line voltage in accordance with the distributing result.

The invention further provides a buffer for compensating a threshold voltage of a neighbor bit. A flash memory comprises a plurality of trapping devices and buffers. Each of the trapping devices corresponds to one of the buffers. Each trapping device has two bits, where each trapping device can store a bit of data. The buffers are connected to each other in series.

A latch register in the buffer is to temporarily store data of the bits, which are to be programmed. A reference signal register is to temporarily store a reference signal, wherein the value of the reference signal is determined by the word line voltage being applied, and the word line voltage, which is supposed to be applied to the bits. The word line voltage applied to the programmed bits is determined by the threshold voltage of the neighbor bit adjacent to the bits, which are to be programmed.

A NOR gate is coupled to the latch register and the reference signal register. The NOR gate judges the signals transmitted from the latch register to the reference signal register and then generates a control signal. The control signal is used to determine whether a bit line voltage is needed to be applied to the bits of the trapping devices.

The same word line voltage and the same bit line voltage are simultaneously applied to the bits in order to program the bits at a same time.

The buffer for compensating a threshold voltage of a neighbor bit of the invention further comprises an adder and a flip-flop.

The adder comprises a plurality of receiving terminals and output terminals. The receiving terminals receive the control signal transmitted from the NOR gate. The control signal acts as a counting basis of the adder. One of the receiving terminals receives a highest bit from an adder of a former buffer and the highest bit is transmitted to the NOR gate.

The flip-flop comprises a plurality of receiving terminals and output terminals. The receiving terminals receive the control signal from the NOR gate. The flip-flop outputs the control signal, and transmits a mark signal back to the NOR gate.

In conclusion, both the method and the buffer for compensating a threshold voltage of a neighbor bit of the invention are to apply different word line voltages according to different threshold voltages of the neighbor bits to the bits in the trapping devices. In addition, during the operation of a low supply-source voltage, the bits, to which a same word line voltage is applied, can be distributed to a same group so that charge pumping circuits can provide enough energy to program the clustered bits at a same time. As a result, charges can be attracted relatively fast and programming time can be cut down.

Both the foregoing general description and the following detailed description are exemplary and explanatory only and are not restrictive of the invention, as claimed.

DESCRIPTION OF THE PREFERRED EMBODIMENTS

Figure 3:
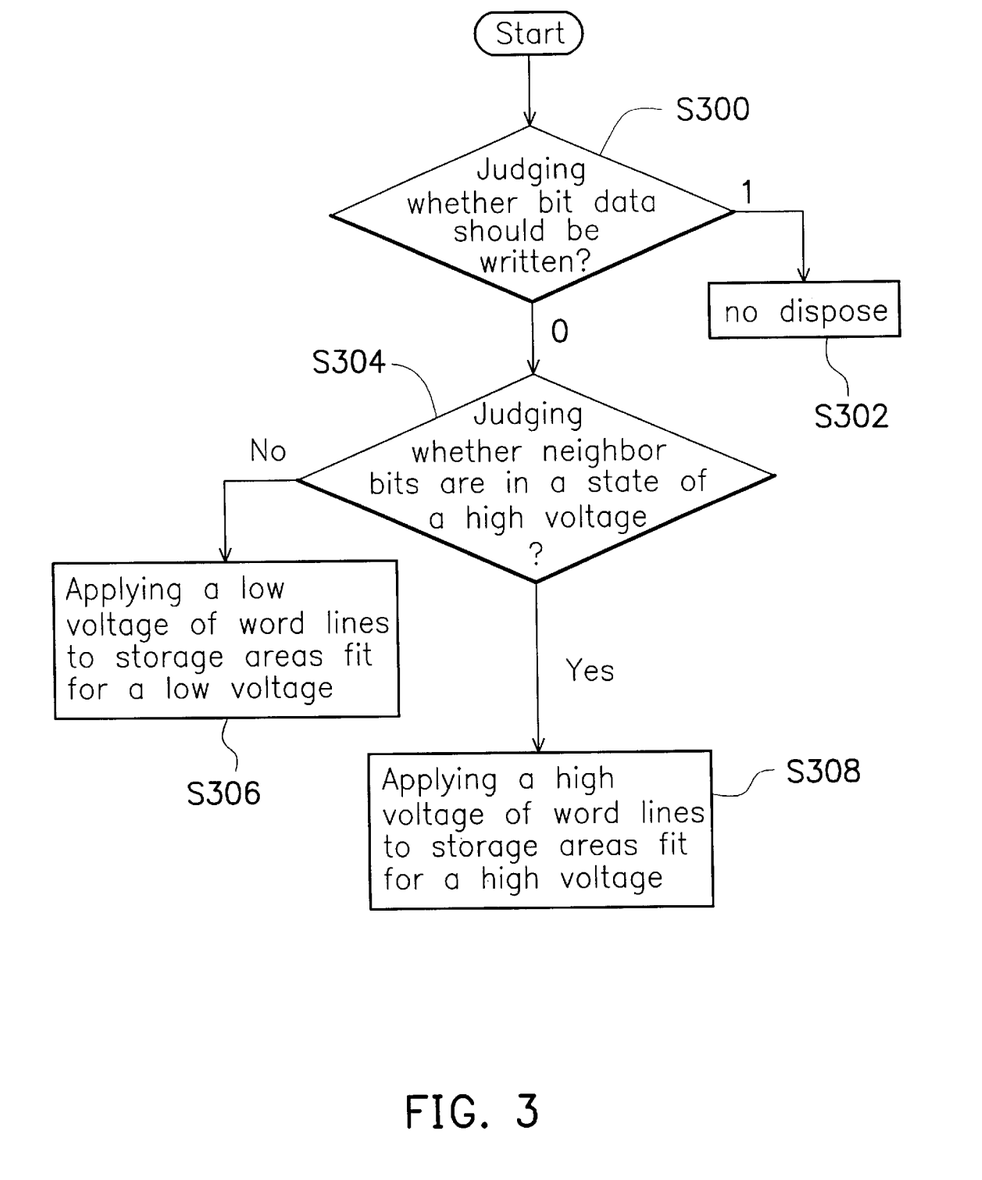
FIG. 3 is a flow chart for arbitrating word line voltages according to one preferred embodiment of this invention.

Referring to FIG. 3, a method for compensating threshold voltages of neighbor bits is illustrated according to one preferred embodiment of this invention. A flash memory comprises many trapping devices, shown in FIG. 2. Each of the trapping devices comprises two bits, a bit 106 and a bit 108, wherein each of the bits can store a bit of data.

A method for compensating a threshold voltage of the neighbor bits will be described as follow. Firstly, step S300 is performed to judge whether the bits should be programmed. The invention supposes that a bit data of value "1" is written into the bit 106 or 108 while data are being erased. As a result, if the value of the programmed-bit data is "1", no action will be performed (step S302).

If the value of the programmed-bit data is "0" in step S300, the programmed-bit data should be written into the storage area of the bit 106 or 108. Following, step S304 is performed. Step S304 determines the word line voltages of the programmed bits of value "0" by using the threshold voltages of the neighbor bits adjacent to the programmed bits of value "0".

In step S304, if the neighbor bits adjacent to the programmed bits of value "0" are in the state of a high threshold voltage, a high word line voltage will be applied to the programmed bits of value "0".

On the contrary, in step S304, if the neighbor bits adjacent to the programmed bits of value "0" are in a state of a low threshold voltage, a low word line voltage is applied to the programmed bits of value "1".

As described above, the invention supposes that the bit data of value "1" is written into the bits while data is being erased. As a result, the bit data valued at "1" is the not-to-be-programmed data; the bit data valued at "0" is the to-be-programmed data. However, the application of the invention is not limited to the above description. It is possible that bit data of value "1" is also regarded as the to-be-programmed data while bit data of value "0" is regarded as the not-to-be-programmed data.

Figure 4:
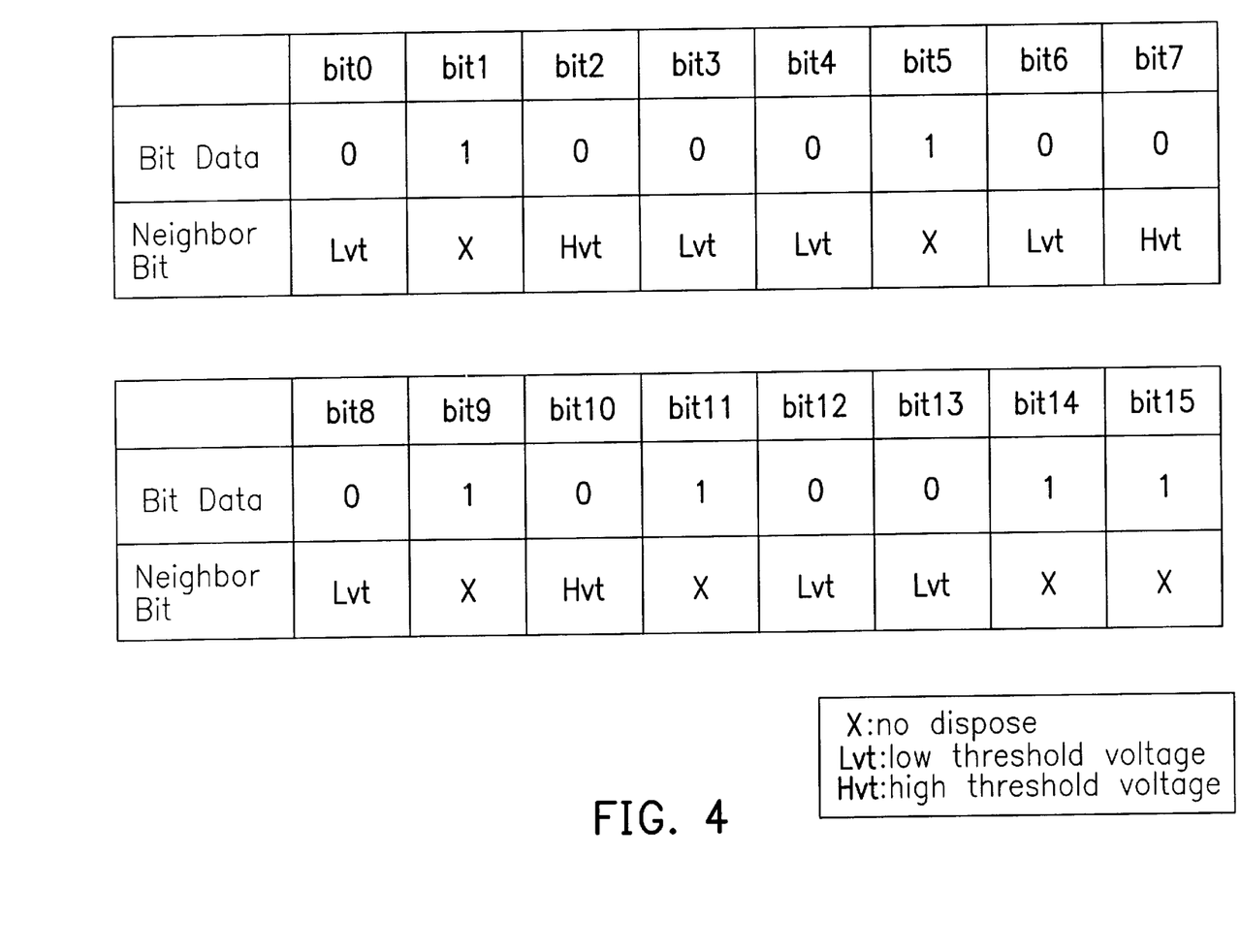
FIG. 4 is a schematic drawing of one preferred embodiment of this invention.

FIG. 4 is a table for judging the word line voltage of each bit. As shown in FIG. 4, the embodiment, for instance, uses a judgement of 16 bits once. Following the above descriptions, the bit data of bit 1, bit 5, bit 9, bit 11, bit 14, and bit 15 are the not-to-be-programmed data. Therefore, a high word line voltage should be applied to the bit 2, bit 7 and bit 10 in order to program these bits. A low word line voltage should be applied to the bit 0, bit 3, bit 4, bit 6, bit 8 bit 12 and bit 13 in order to program these bits.

In summary, the purpose of applying different word line voltages to the bits is to increase a speed of attraction between electric charges while a high word line voltage is applied to the bits which are fit for a high voltage. Consequently, the programming speed can become faster. Moreover, another purpose of applying different word line voltages to the bits is to decrease a load of electric charges while a low word line voltage is applied to the bits which are fit for a low voltage.

Figure 5:
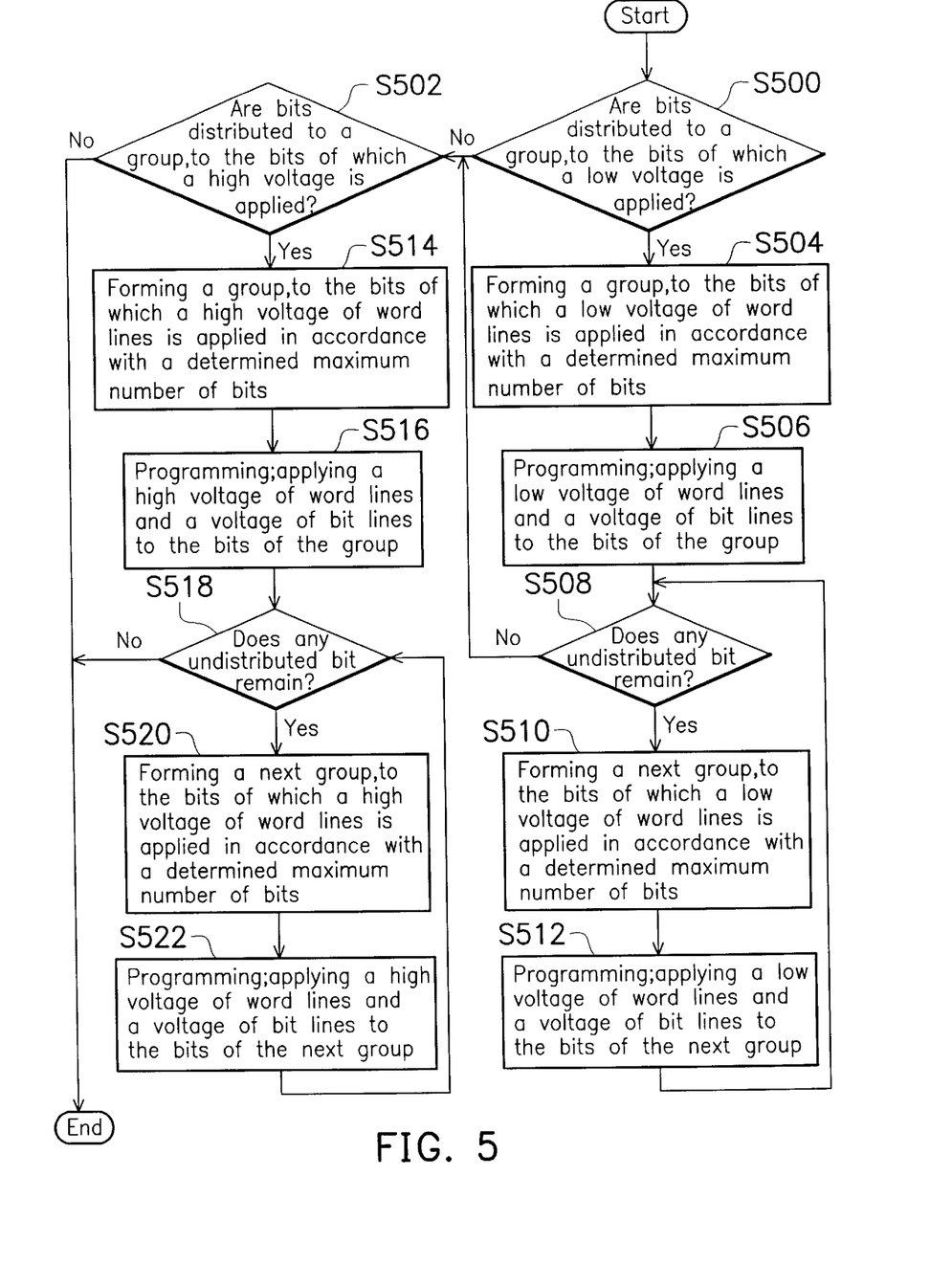
FIG. 5 is a flow chart for distributing bits to groups according to one preferred embodiment of this invention.

FIG. 3, FIG. 4, and FIG. 5 show a method for compensating threshold voltages of the neighbor bits according to another embodiment of this invention. The method improves the condition that the charge pumping circuits are not supplying enough energy to a relatively large number of memory cells during the operation of a low power-source voltage to program a relatively large number of memory cells simultaneously.

The steps of the embodiment also include the step of judging whether bits should be programmed (Step S300) and the step of judging whether the word line voltages applied to the bits, which are to be programmed are in a state of hgh voltage(Step S304). These steps are illustrated above and it is unnecessarily to state them again.

After the step of judging whether the word line voltages applied to the bits, which are to be programmed are in a state of high voltage(Step S304), clustering of the bits, which are to be programmed is performed. Consequently, the charge pumping circuits can provide enough energy for the clustered bits to make the bits simultaneously programmed in the same cluster.

Therefore, steps S500 to S522 of FIG. 5 illustrate a clustering operation of the bits, which are to be programmed according to FIG. 4.

The step S500 is to judge whether bits are distributed to a low word line voltage group. If not, The step S502 is to judge whether bits are distributed to a high word line voltage group. If not, it is indicated that no bit should be programmed and the programming operation is finished.

There are reserved bit spaces, to store bits which can be programmed at a same time, in the low word line voltage group and in the high word line voltage group. However, the reserved bit spaces cannot surpass a fixed bit number in the low power-source voltage. Therefore, the invention supposes that every group cannot surpass 4 bits. If the bits are distributed to the low word line voltage group (Step S500), the first low word line voltage group is composed according to a determined maximum bit number of bits which can be programmed simultaneously (Step S504). Following, in the step S506, the bits in the first group are programmed, that is, a low word line voltage (WL) and a low bit line voltage (BL) are applied to the bits of the first low word line voltage group.

Referring to an example of FIG. 4, the first low word line voltage group includes the bit 0, bit 3, bit 4, and bit 8. A low word line voltage and a low bit line voltage are applied to these bits of the first low word line voltage group.

If undistributed bits remain (Step S508), a next low word line voltage group is composed according to a determined maximum number of bits which can be programmed simultaneously (Step S510). Referring to the example of FIG. 4, the next low word line voltage group includes bit 6, bit 12, and bit 13.

After the bits of the next low word line voltage group are programmed (Step S512), if undistributed bits still remain (Step S508), distributing (Step S510) and programming (Step S512) is continued. Otherwise, a step S502 should be implemented, and the step S502 is to judge whether bits are distributed to a high word line voltage group. If no bit is distributed to a high word line voltage group, distributing and programming operations is finished. If the bits are distributed to a high word line voltage group, a first high word line voltage group is composed according to a determined maximum number of bits which can be programmed simultaneously (Step S514). The first high word line voltage group includes bit 2, bit 7, and bit 10. Following, in the step S516, the bits of the first high word line voltage group are programmed, that is, a high word line voltage and a high bit line voltage are applied to the bits of the first high word line voltage group.

If undistributed bits remain (Step S518), a next high word line voltage group is composed according to a determined maximum number of bits which can be programmed simultaneously (Step S520). After the bits of the next high word line voltage group are programmed (Step S522), if undistributed bits still remain (Step S518), distributing (Step S520) and programming (Step S522) is continued. Otherwise, distributing and programming is finished. Referring to the example of FIG. 4, there is no remaining bit, to which a high word line voltage should be applied, so distributing as well as programming are finished.

Referring to the above-mentioned steps, the bits which are to be programmed are distributed so that the charge pumping circuits can provide enough energy to program the bits in the same group simultaneously.

Figure 6:
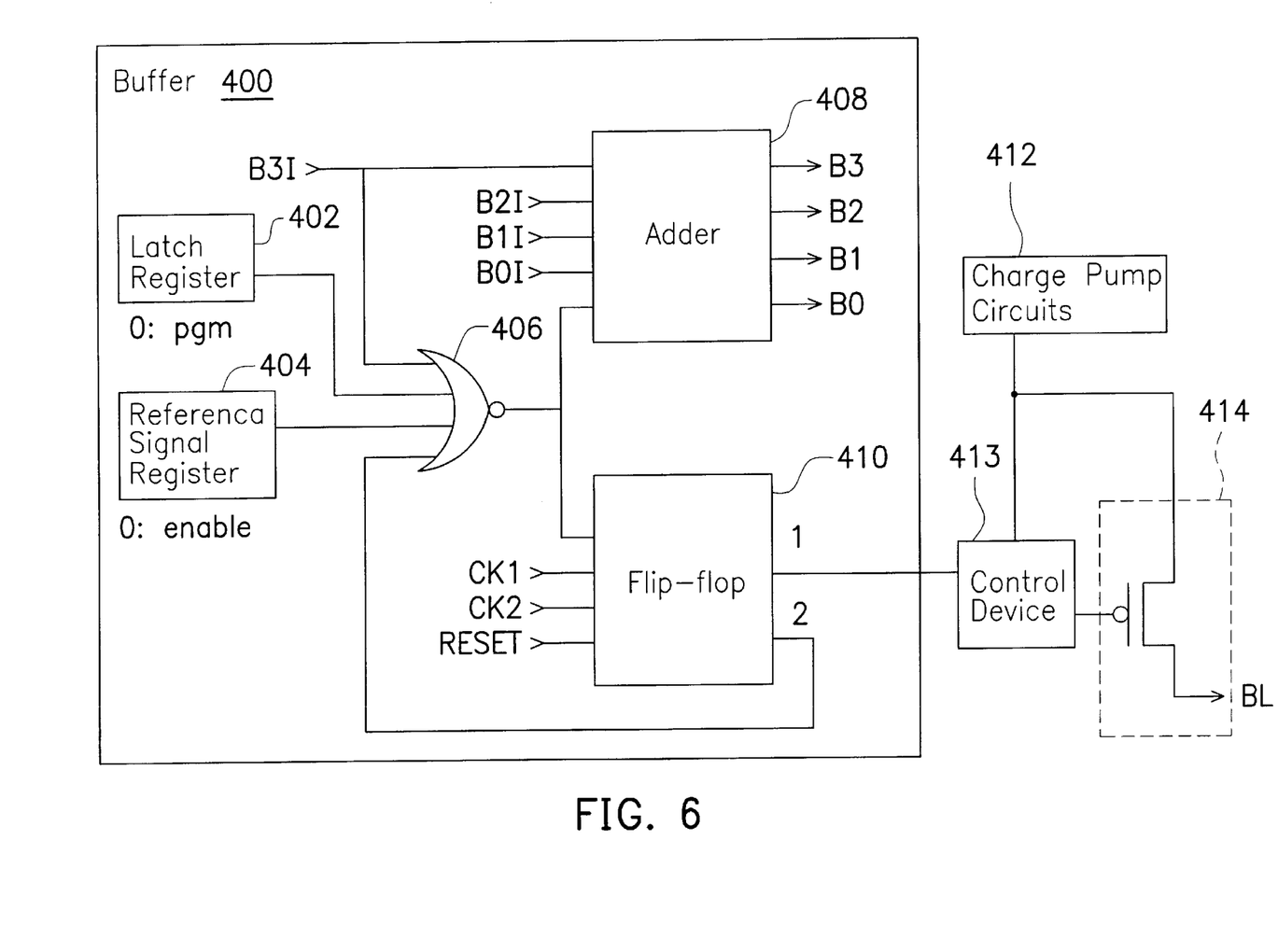
FIG. 6 is a structure diagram of a buffer according to one preferred embodiment of this invention.
Figure 7:
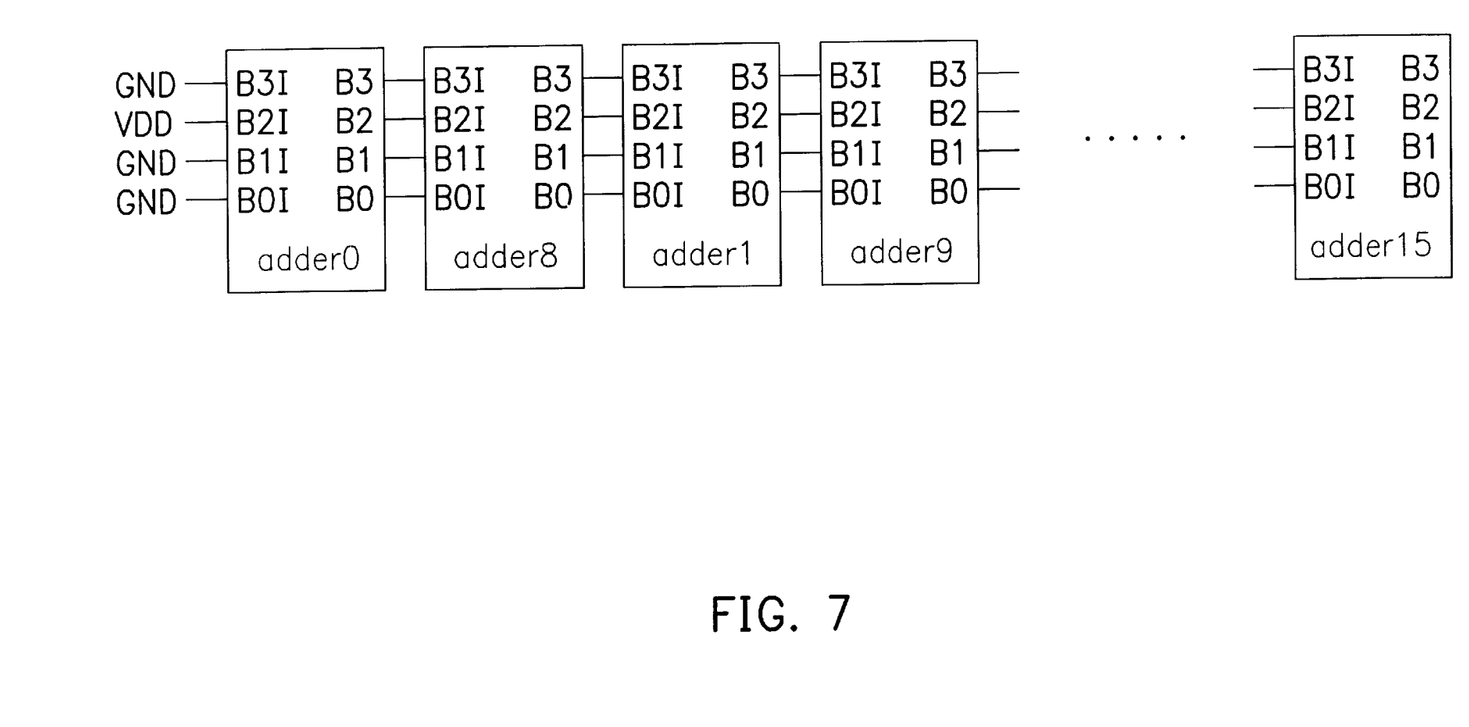
FIG. 7 is a circuit diagram according to one preferred embodiment of this invention.

Referring to FIG. 4, FIG. 6, and FIG. 7, a buffer for compensating a threshold voltage of a neighbor bit according to another embodiment of the invention is illustrated.

A flash memory comprises many trapping devices, shown in FIG. 2. Each trapping device corresponds to a buffer, as shown in FIG. 6. Each of the trapping devices comprises two bits, a bit 106 and a bit 108. As shown in FIG. 7, the buffers are connected in series. The first buffer corresponds to bit 0 among the 16 bits, shown in FIG. 4. The second buffer corresponds to bit 8. The third buffer corresponds to bit 2. The forth buffer corresponds to bit 9, such as the like. The inner members of each buffer are identical and, therefore, only a buffer 400 shown in FIG. 6 is illustrated.

A latch register 402 of the buffer 400 is used to temporarily store bits, which are to be programmed. The invention supposes that bit data with a value of "1" is written into the bits while the bits are being erased. As a result, if the value of the programmed-bit data is "1", no action is performed; if the value of the programmed-bit data is "0", it is necessary to program the bits.

A reference signal register 404 is used to temporarily store a reference signal. The value of the reference signal is determined by the word line voltage being applied, and the word line voltage, which is supposed to be applied to the bit while being programmed.

Accordingly, if a low word line voltage is being applied and, while bit 0 shown in FIG. 4 is being programmed, the low word line voltage is supposed to be applied to bit 0, the value of the reference signal is "0". However, while bit 2 shown in FIG. 4 is being programmed, the high word line voltage is supposed to be applied to bit 2, and a value of the reference signal is "1".

The word line voltage, applied to bit 0 and bit 2, is determined by a threshold voltage of the neighbor bit adjacent to bit 0 or bit 2. Each of the trapping devices are provided with two bits of spaces. When bit 2, the neighbor bit adjacent to which is in a state of high threshold voltage, is programmed, the high word line voltage should be applied to bit 2. Therefore, while bit 2 is programmed, the speed of attraction between electric charges increases.

When a bit is programmed, the adjacent neighbor bit is in a state of low threshold voltage, therefore the bit should be programmed with a low word line voltage, such as bit 0. Accordingly, it is unnecessary to apply a high word line voltage to all bits while the bits are programmed. The speed of attraction between electric charges can be kept fast and the load of electric charge can decrease.

When a bit is programmed, a word line voltage and a bit line voltage are applied to the bit. While a bit is being programmed, the value of the reference signal register 404 determines the word line voltage, and then the word line voltage will be applied to the bit. A NOR gate 406, connected to the latch register 402 and the reference signal register 404, arbitrates signals delivered by the latch register 402 and the reference signal register 404 and then generates control signals. The control signals are used to determine whether the bit line voltage should be applied to the bit while the bit is being programmed. Whenever the control signals are in a state of "Enable", a control device 413, such as Level Shifter can direct to open a passage of a pass transistor 414. As a result, the charge bumping circuits can transmit a bit line voltage from the opened pass transistor 414 to the bit, which is to be programmed. However, whenever the control signals are in a state of "Disable", the control device 413 can direct not to open a passage of a pass transistor 414. As a result, the charge bumping circuits will not transmit the bit line voltage from the pass transistor 414, which is not opened to the bit, which are to be programmed.

In order to program the bits in the group with the same word line voltage, the word line voltage and the bit line voltage can be simultaneously applied to the bits.

As shown in FIG. 4, a high word line voltage should be applied to bit 2, bit 7, and bit 10 while these bits are being programmed. Consequently, the high word line voltage and the high bit line voltage can be simultaneously applied to bit 2, bit 7, and bit 10. However, the low word line voltage should be applied to bit 0, bit 3, bit 4, bit 6, bit 8, bit 12, and bit 13 while these bits are being programmed. Consequently, the low word line voltage and the bit line voltage can be simultaneously applied to bit 0, bit 3, bit 4, bit 6, bit 8, bit 12, and bit 13.

Referring to FIG. 4, FIG. 6, FIG. 7, FIG. 8, FIG. 9, FIG. 10, and FIG. 11, the buffer for compensating the threshold voltage of a neighbor bit is illustrated according to another preferred embodiment of this invention.

A buffer 400, for compensating the threshold voltage of the neighbor bit, includes a latch register 402, a reference signal register 404, and a NOR gate 406, all of which are mentioned in the last embodiment. The functions and the connecting modes thereof are same.

Figure 8:
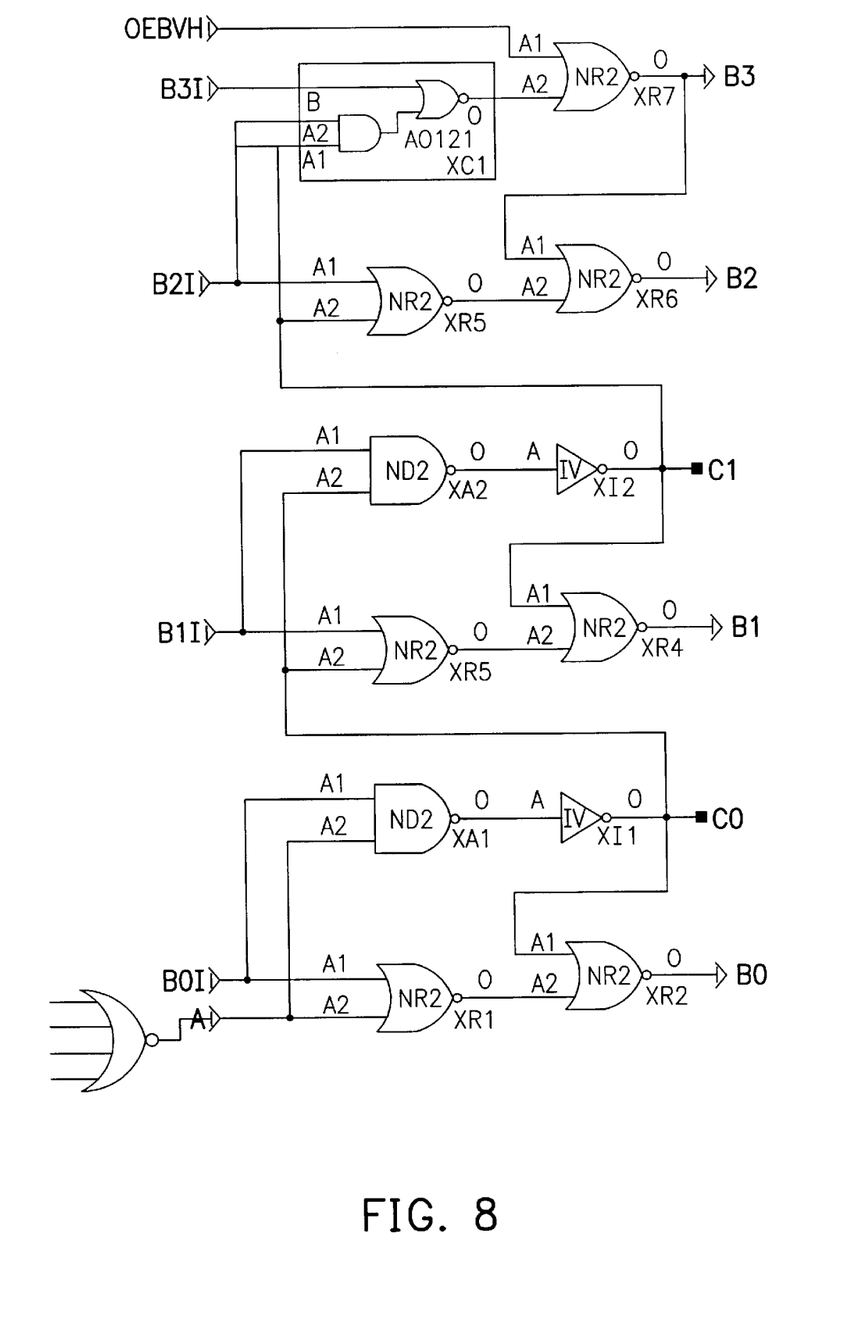
FIG. 8 is a circuit diagram of an adder according to one preferred embodiment of this invention.
Figure 9:
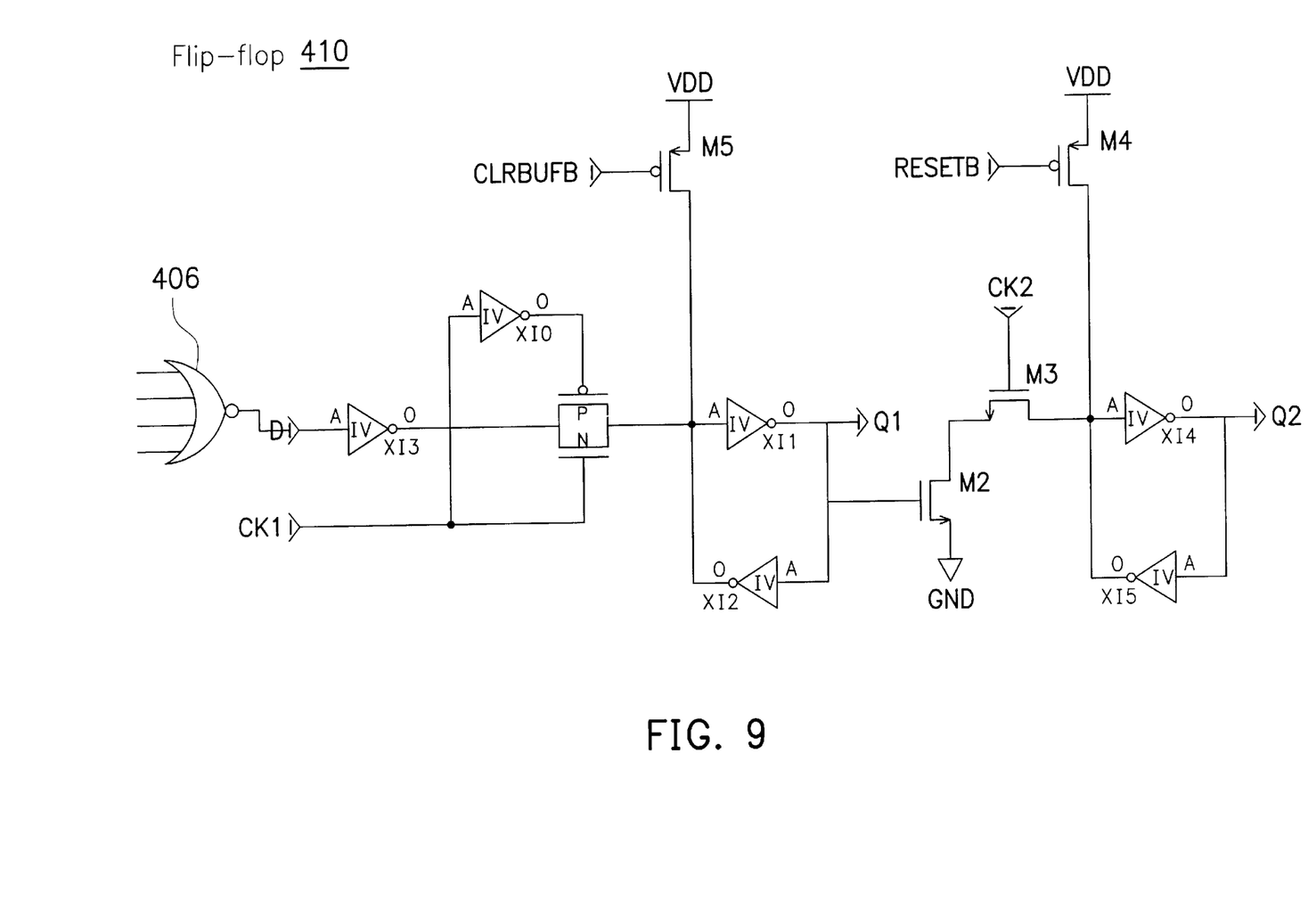
FIG. 9 is a circuit diagram of a flip-flop according to one preferred embodiment of this invention.

In the embodiment, the buffer 400, for compensating a threshold voltage of a neighbor bit, further includes an adder 408 and a flip-flop 410, wherein FIG. 8 shows the inner circuits of an adder in each buffer and FIG. 9 shows the inner circuits of a flip-flop in each buffer.

The adder 408 includes receiving terminals B0I, B1I, B2I, B3I and output terminals B0, B1, B2, B3 wherein the receiving terminals of the adder 408 receive count bit data transmitted from the output terminals of a former adder, as shown in FIG. 7. FIG. 7 shows a diagram of the buffer structure in series connection.

If the adder 408 is the adder 8 of the buffer structure in series connection shown in FIG. 7, the receiving terminal B3I of the adder 408 receives the highest bit value from the adder 0 of the former buffer. The highest bit value is also transmitted to a NOR gate 406 and serves as a basis of generating a control signal. A control signal generated by the NOR gate 406 is transmitted to the adder 408 and regards as a counting basis of the adder.

The flip-flop 410 includes many receiving terminals and output terminals wherein a receiving terminal D is used to receive a control signal transmitted from the NOR gate 406. The flip-flop 410 outputs the received control signal and transmit a mark signal back to the NOR gate 406.

The adder 408 and the flip-flop 410 of the embodiment are devices to distribute the bits, to which a same word line voltage is applied. Because energy provided by the charge bumping circuits 412 is finite during a low supply-voltage operation, it is not possible to supply enough energy to a bit line voltage, applied to all bits once, while the bits are being programmed. Therefore, it is necessary that the bits, to which a same word line voltage is applied, should be clustered. The number of bits in each group is only maintained by a determined number, and thus the charge pumping circuits 412 apply once a bit line voltage only to some bits, to which a same word line voltage is applied. As a result, energy insufficiency will not occur.

If the adder 408 is given an initial value "4" in the initial state, a receiving terminal B2I of an adder of a first buffer, as shown in FIG. 7, is valued at "1". Now, a low word line voltage group is being differentiated. According to the example of FIG. 4, a low word line voltage should be applied to all of bit 0, bit 3, bit 4, bit 6, bit 8, bit 12 and bit 13 while these bits are being programmed. However, it is not possible to simultaneously program so many bits. Accordingly, a group is determined to have only four bits. Because the adder 408 is given an initial value "4" in the initial state, when the adder 408 counts to "8" (the output terminal B3 thereof is 1), follow-up bits can not be brought into the low word line voltage group. As a result, according to series connection between these buffers, a first low word line voltage group is bit 0, bit 8, bit 3, and bit 4. A second low word line voltage group is bit 12, bit 13, and bit 6.

Figure 10:
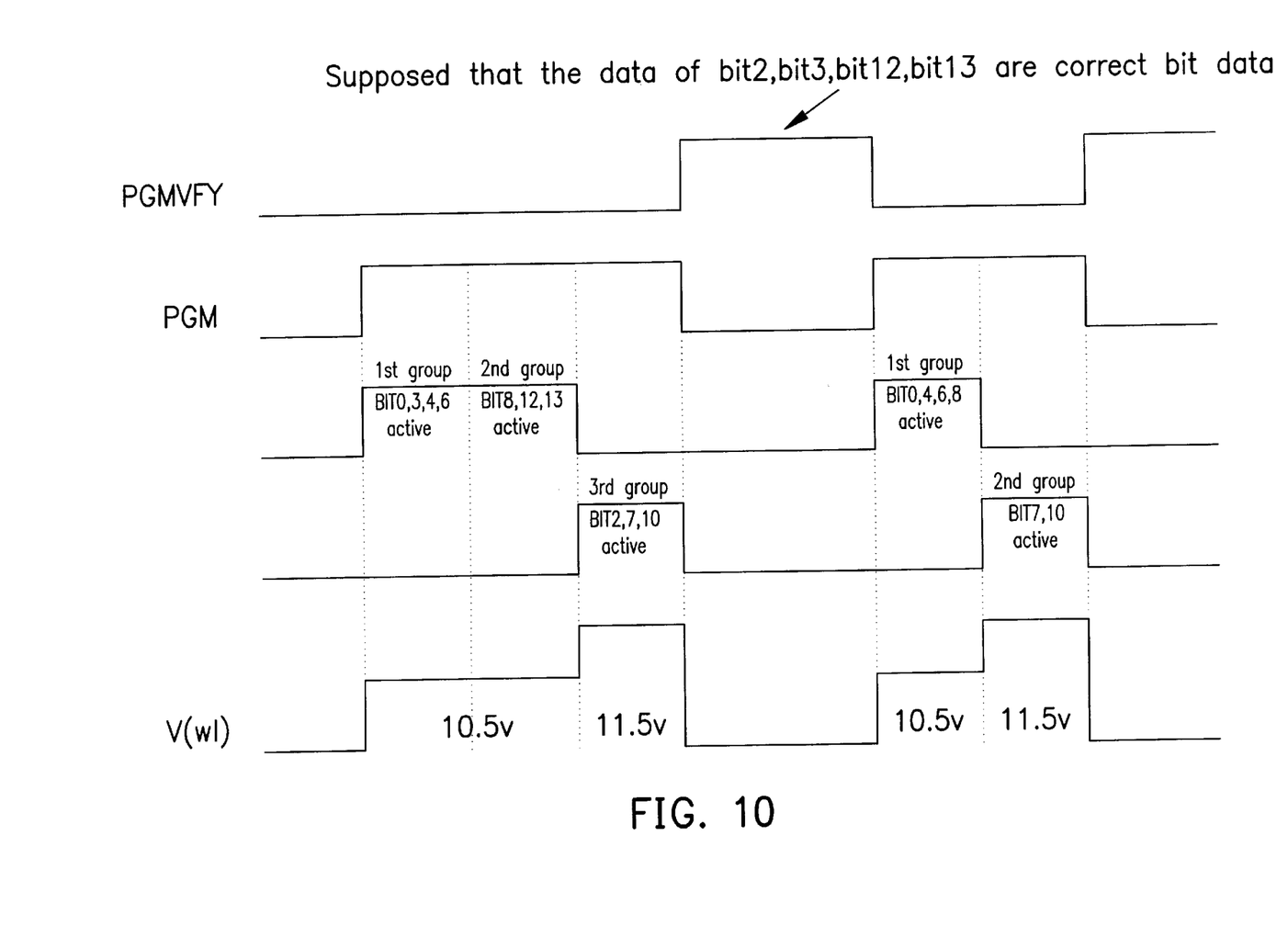
FIG. 10 is a schematic drawing according to one preferred embodiment of this invention.
Figure 11:
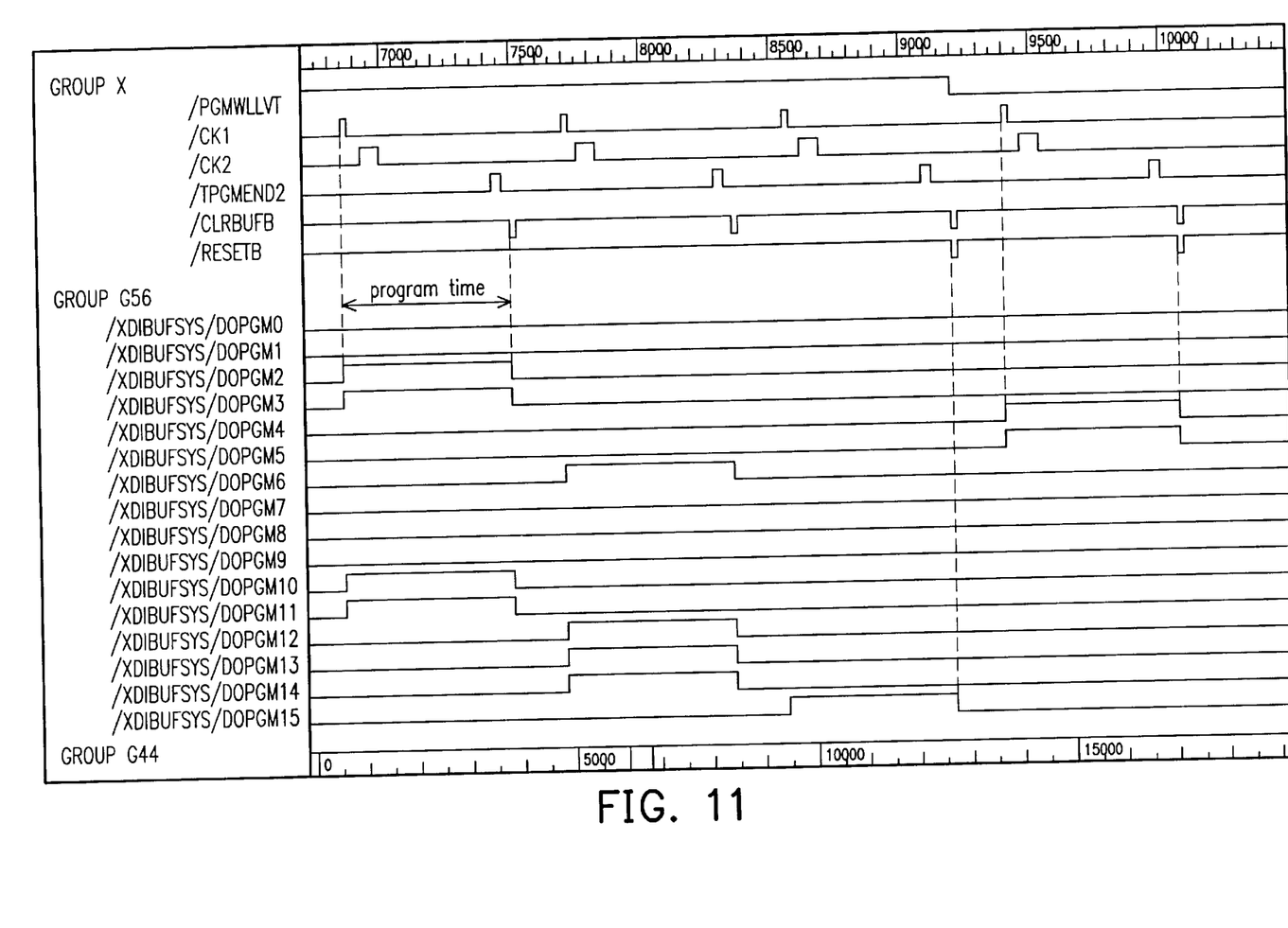
FIG. 11 is a chart of pulse waves according to one preferred embodiment of this invention.

FIG. 10 and FIG. 11 show the timing diagrams. As shown in FIG. 10 and FIG. 11, at first, a low word line voltage is applied to the bits of the first group and then applied to the bits of the second group.

When distribution of the first low word line voltage group is performed, the flip-flops of the buffers corresponding to the bits, which have already been clustered in the first group, output a mark signal back to the NOR gate 406. Therefore, when distribution of the next low word line voltage group is performed, whether the bits have already been distributed can be known according to the mark signals. If the bits have already been distributed, they are not distributed again.

The rest may be deduced by analogy. A third high word line voltage group includes bit 2, bit 10, and bit 7. In addition, when a word line voltage is applied to the bits of a group, a bit line voltage is also applied to the bits of the group. Therefore, the bits of the group can be programmed.

According to the above, advantages of the invention includes:

1. According to the invention, while a bit of a trapping device is being programmed, the bit can be compensated according to a threshold voltage of a neighbor bit adjacent to the bit.
2. Because the distribution mode is dynamic distribution, it is more efficient than conventional steady distribution.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for compensating a threshold voltage of a neighbor bit in a flash memory including a plurality of trapping devices wherein each of which has two bits, the method comprising:

arbitrating word line voltages of the bits which are to be programmed according to threshold voltages of neighbor bits adjacent to the bits which are to be programmed;

first distributing the bits, to which a first word line voltage should be applied, to a first group of bits with a same word line voltage;

first applying the first word line voltage to the bits of the first group of bits with the same word line voltage in accordance with the result of the first distribution;

second distributing the bits, to which a second word line voltage should be applied, to a second group of bits with a same word line voltage; and second applying the second word line voltage to the bits of the second group of bits with the same word line voltage in accordance with the result of the second distribution.

2. The method according to claim 1, wherein the first word line voltage is applied to the bits which are to be programmed while the neighbor bits adjacent to the programmed bits are in a state of a first threshold voltage, and the second word line voltage is applied to the bits which are to be programmed while the neighbor bits adjacent to the programmed bits are in a state of a second threshold voltage.

3. The method according to claim 1, wherein the first group of bits with the same word line voltage and the second group of bits with the same word line voltage have reserved bit spaces used for storing the bits which are programmed simultaneously, and the number of bits programmed simultaneously cannot exceed a determined-maximum-bit number.

4. The method according to claim 3, wherein if there is any bit space remaining in the first group of bits with the same word line voltage, the bits that are not distributed to the first group of bits with the same word line voltage are distributed to the second group of bits with the same word line voltage.

5. The method according to claim 1, wherein when the first word line voltage is applied to the bits of the first group with the same word line voltage, a first bit line voltage is applied to the bits of the first group with the same word line voltage, and when the second word line voltage is applied to the bits of the second group with the same word line voltage, a second bit line voltage is applied to the bits of the second group with the same word line voltage.

6. A method for compensating a threshold voltage of a neighbor bit in a flash memory including a plurality of trapping devices wherein each trapping device has two bits, the method comprising:

arbitrating word line voltages of the bits which are to be programmed, wherein the word line voltages are arbitrated according to threshold voltages of neighbor bits adjacent to the bits which are to be programmed; and applying a same word line voltage to the bits simultaneously.

7. The method according to claim 6, wherein a low word line voltage is applied to the bits which are to be programmed while the neighbor bits adjacent to the programmed bits are in a state of a low threshold voltage, and a high word line voltage is applied to the bits demanded to be programmed while the neighbor bits adjacent to the programmed bits are in a state of a high threshold voltage.

8. A buffer for compensating a threshold voltage of a neighbor bit in a flash memory including a plurality of trapping devices and a plurality of the buffers wherein each of the trapping devices corresponds to one of the buffers and has two bits, and the buffers are connected each other in series, the buffer comprising:

a latch register for temporarily storing data of the bits which are to be programmed;

a reference signal register for temporarily storing a reference signal, wherein the reference signal has a value determined by a word line voltage being applied, and a word line voltage, which is determined by a threshold voltage of neighbor bits adjacent to the bits, is supposed to be applied to the bits while the bits are being programmed;

a NOR gate coupled to the latch register and the reference signal register, wherein the NOR gate is used for judging signals transmitted from the latch register and the reference signal register and then generating a control signal to determine whether a bit line voltage is needed to be applied to the bits of the trapping devices;

an adder having a plurality of receiving terminals and output terminals, wherein the receiving terminals receive the control signal, which acts as a counting basis of the adder, transmitted from the NOR gate, and a highest bit received by one of the receiving terminals is transmitted to the NOR gate; and a flip-flop having a plurality of receiving terminals and output terminals, wherein the receiving terminals of the flip-flop receive the control signal from the NOR gate, the flip-flop outputs the control signal and transmits a mark signal back to the NOR gate.

9. The buffer according to claim 8, wherein the highest bit received by the adder is outputted by an adder of a former buffer.

10. The buffer according to claim 9, wherein data received by the adder includes the highest bit, another bit which is outputted by the adder of the former buffer, and the value of the control signal outputted by the NOR gate.

11. The buffer according to claim 10, wherein the adder determines the number of trapping devices to which a same word line voltage is simultaneously applied according to a sum of a value outputted by the adder of the former buffer and the control signal.

12. The buffer according to claim 11, wherein the bits, to which a same word line voltage is applied, are distributed to a same group.

13. The method according to claim 8, wherein the mark signal is used to mark the buffer that has already generated the control signal.

14. A buffer for compensating a threshold voltage of a neighbor bit in a flash memory including a plurality of trapping devices and a plurality of the buffers wherein each of the trapping devices corresponds to one of the buffers and each trapping device has two bits, and the buffers are connected each other in series, the buffer comprising:

a latch register for temporarily storing data of the bits which are to be programmed;

a reference signal register for temporarily storing a reference signal, wherein the reference signal has a value determined by a word line voltage being applied, and a word line voltage which is determined by a threshold voltage of neighbor bits adjacent to the bits, is supposed to be applied to the bits while the bits are being programmed; and a NOR gate coupled to the latch register and the reference signal register, wherein the NOR gate is used for judging signals transmitted from the latch register and the reference signal register and then generating a control signal to determine whether a bit line voltage is needed to be applied to the bits of the trapping devices, wherein a same word line voltage and a same bit line voltage are simultaneously applied to the bits in order to program the bits at a same time.

* * * * *